United States Patent [19]

Blomley et al.

[11] Patent Number: 4,893,117

[45] Date of Patent: Jan. 9, 1990

[54] LIQUID CRYSTAL DRIVING SYSTEMS

[75] Inventors: Peter F. Blomley, Bishop's Stortford; Peter J. Ayliffe, Stansted; Ewen R. M. Huffman; Gregory W. M. Yuen, both of Bishop's Stortford, all of Great Britain

[73] Assignee: STC PLC, London, England

[21] Appl. No.: 74,945

[22] Filed: Jul. 17, 1987

[30] Foreign Application Priority Data

Jul. 18, 1986 [GB] United Kingdom ................. 8617593
Nov. 27, 1986 [GB] United Kingdom ................. 8628364

[51] Int. Cl.$^4$ ............................................. G09G 3/00
[52] U.S. Cl. ..................................... 340/784; 340/805; 340/811; 350/333
[58] Field of Search ............... 340/784, 805, 811, 715; 350/333, 350 S; 358/236

[56] References Cited

U.S. PATENT DOCUMENTS

| 3,653,745 | 4/1972 | Mao ...................................... 340/784 |
| 3,654,606 | 4/1972 | Marlowe et al. .................... 340/784 |
| 4,048,633 | 9/1977 | Sano ..................................... 340/784 |
| 4,203,104 | 5/1980 | Kmetz ................................. 340/784 |
| 4,300,138 | 11/1981 | Nakauchi et al. ................... 340/811 |
| 4,390,892 | 6/1983 | Murakami et al. ................... 340/715 |
| 4,408,201 | 10/1983 | Harada ................................ 340/784 |
| 4,636,788 | 1/1987 | Hilbrink ............................ 340/784 |
| 4,705,345 | 11/1987 | Ayliffe et al. ....................... 340/784 |
| 4,716,403 | 12/1987 | Morozumi .......................... 340/784 |

OTHER PUBLICATIONS

Coates, et al, "Electrically induced scattering textures in smectic A phases and their electrical reversal", Journal Physics D: Applied Physics, vol. II, pp. 1-10, 1978.

Primary Examiner—David K. Moore
Assistant Examiner—M. Fatahiyar
Attorney, Agent, or Firm—Lee, Mann, Smith, McWilliams & Sweeney

[57] ABSTRACT

A drive circuit for a liquid crystal display uses a sampling technique to derive drive signals from a pair of input waveforms. The waveforms comprise positive going and negative going trapezoidal pulses. By sampling the waveforms at appropriate points, single cycle AC signals and zero voltage signals can be provided. The technique subjects the drive circuit to a voltage stress that is lower than that provided by conventional techniques.

4 Claims, 9 Drawing Sheets

Fig.2.
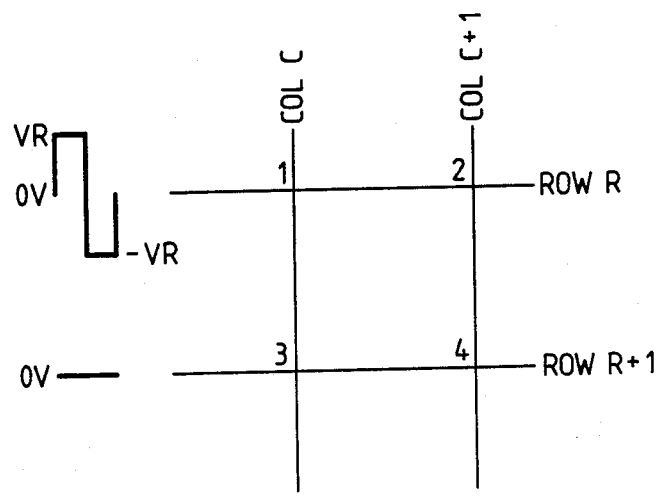
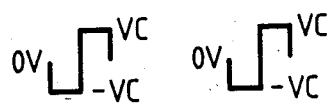
| PIXEL NO. | PEAK PIXEL VOLTAGE | EFFECT |
|---|---|---|
| 1 | VR + VC | SCATTER |
| 2 | VR + VC | SCATTER |
| 3 | VC | NONE |
| 4 | VC | NONE |

Fig. 3.
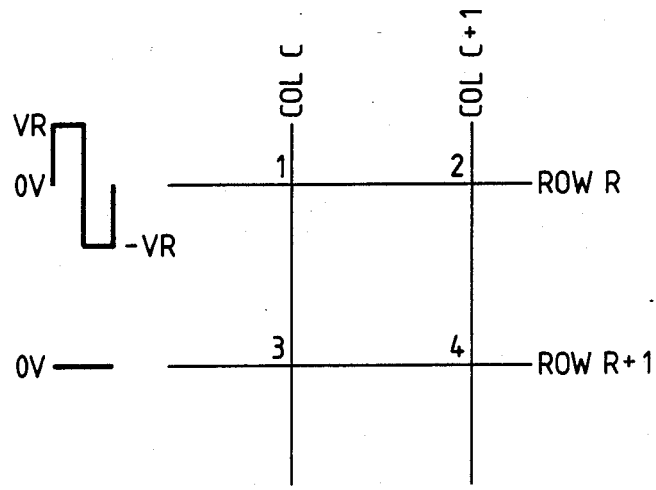
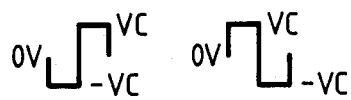
| PIXEL NO. | PEAK PIXEL VOLTAGE | EFFECT |
|---|---|---|
| 1 | VR + VC | CLEAR |
| 2 | VR − VC | NONE |
| 3 | VC | NONE |
| 4 | VC | NONE |

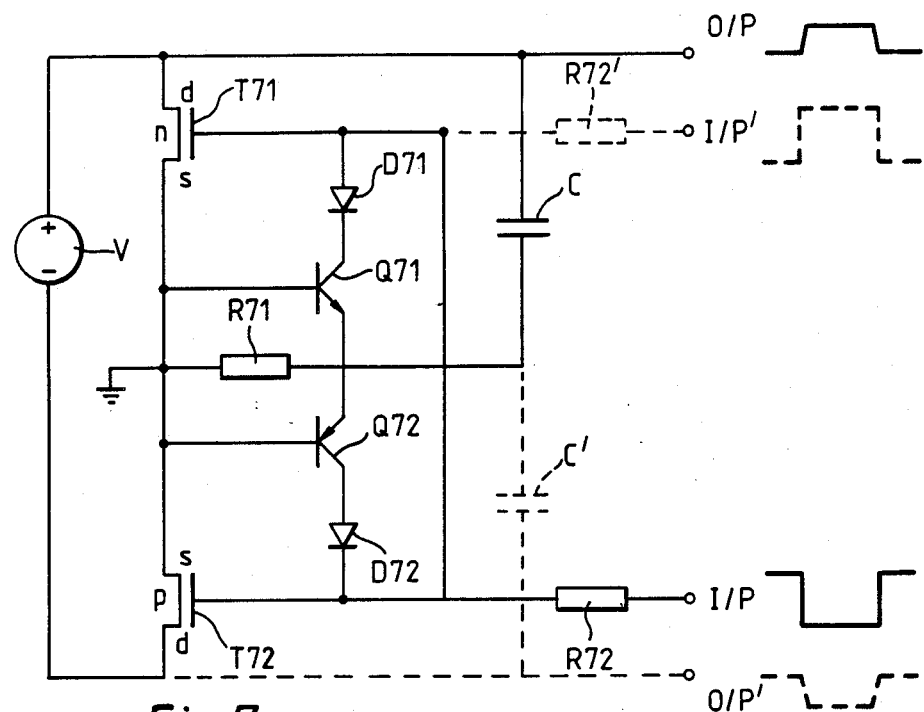
Fig. 7.
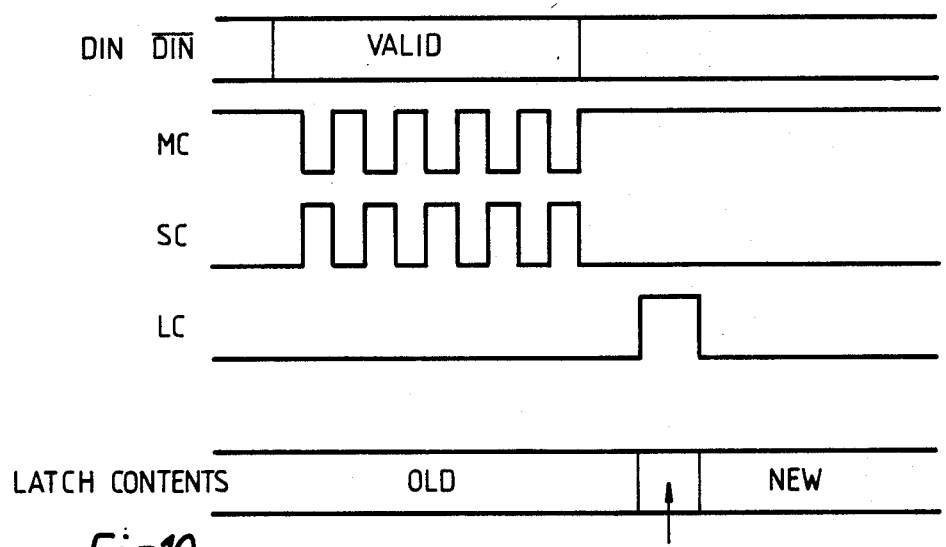
Fig. 10. DATA LOADING SEQUENCE

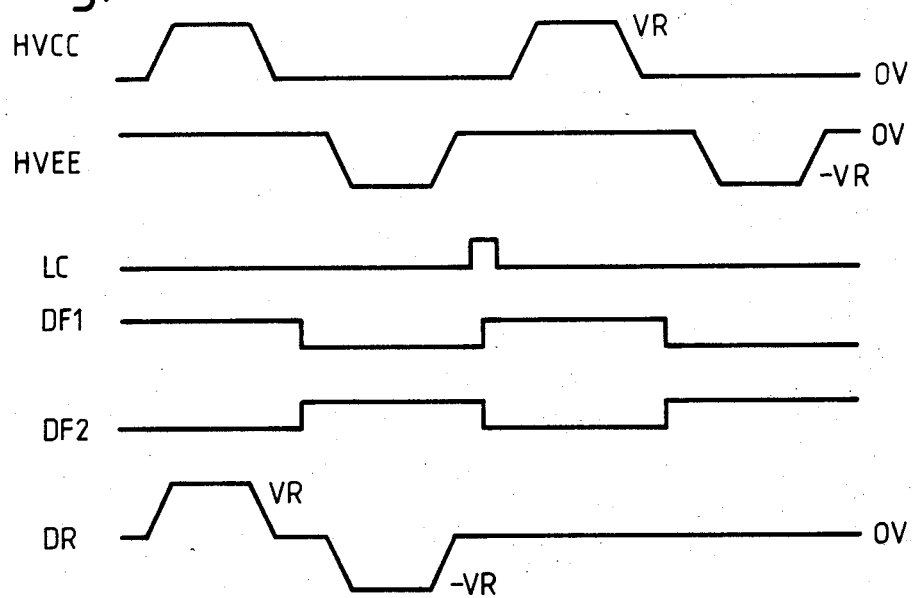
Fig.11. ROW DRIVER WAVEFORMS
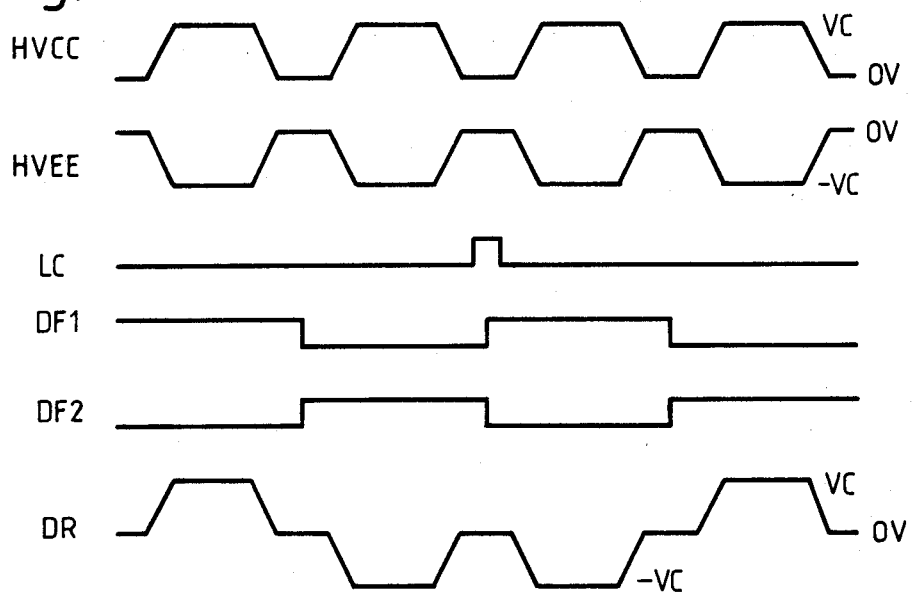
Fig.12. COLUMN DRIVER WAVEFORMS

LIQUID CRYSTAL DRIVING SYSTEMS

This invention relates to matrix addressed displays and in particular to drive circuits for operating such displays.

BACKGROUND OF THE INVENTION

Large area matrix addressed displays, e.g. of the smectic liquid crystal type, are being introduced in a number of applications. These displays are particularly attractive for their excellent viewing characteristics. In such a display an array of pixels are switched between scattering and clear conditions by the application of suitable voltage waveforms to corresponding row and column conductors. The switching mechanism is described in our United Kingdom Patent Specification No. 1,557,199 (W. A. Crossland - J. Morrissy - B. Needham 10-7-1) and in a paper entitled "Electrically induced scattering textures in smectic-A phases and their electrical reversal" published in the Journal of Physics D: Applied Physics, Volume 11 pages 2025-34.

A disadvantage of present devices resides in the manner in which the row drive waveform is generated. The row waveform comprises a single alternating current cycle of approximately 400 volts peak to peak. In conventional devices this waveform is derived from two direct current power supplies of +200 volts and −200 volts respectively. In consequence the display drive circuitry must be able to withstand an applied voltage difference of about 400 volts. This means that special precautions must be taken and the circuits are consequently costly to manufacture.

The object of the present invention is to minimise or to overcome this disadvantage.

SUMMARY OF THE INVENTION

According to one aspect of the invention there is provided a drive circuit for a matrix addressed display, the circuit including means for sampling selectively a first waveform comprising positive going pulses and a second waveform comprising negative going pulses and for deriving therefrom a series of one-cycle alternating output waveforms and zero voltage signals whereby, in use, the pixels of the display may be scattered, cleared or left unchanged, the arrangement being such that there is a period of zero voltage between successive half cycles of the output waveforms whereby the maximum voltage stress applied to said drive circuit is one half of the peak to peak voltage of said alternating output waveform.

According to another aspect of the invention there is provided a display device, including a matrix addressed smectic liquid crystal display, row drive and column drive circuits for operation of the display, control means for said row and column drive circuits, and a power supply, wherein said power supply is adapted to provide a first waveform comprising positive going pulses and a second waveform comprising negative going pulses, said waveforms being of equal frequency and in mutual antiphase, and wherein each said drive circuit includes means for sampling said waveforms and for deriving therefrom, in response to signals from the control circuit, a series of one cycle alternating output waveforms and zero voltage signals, whereby, in use, the pixels of the display may be scattered, cleared, or left unchanged, the arrangement being such that there is a period of zero voltage between successive half cycles of the output waveforms whereby the maximum voltage stress applied to a said drive circuit is one half of the peak to peak voltage of its corresponding alternating output waveform.

As the power supply signals are selectively sampled, the maximum voltage applied to a driver circuit is one half of the output peak to peak voltage and not, as in previous arrangements, the full peak to peak voltage. The maximum voltage stress on the circuit is thus effectively halved.

BRIEF DESCRIPTION OF THE DRAWINGS

An embodiment of the invention will now be described with reference to the accompanying drawings in which:

FIG. 2 illustrates the row and column waveforms used to scatter individual pixels of the display of FIG. 1;

FIG. 3 illustrates the row and column waveforms used to provide clearing of individual pixels of the display of FIG. 1;

FIG. 7 shows a circuit for generating the alternating supply of FIG. 6;

FIG. 10 illustrates the data loading sequence of the circuit of FIG. 7;

FIGS. 11 and 12 show respectively the row and column drive waveforms associated with the circuit of FIG. 9.

DESCRIPTION OF PREFERRED EMBODIMENT

Figure 1:
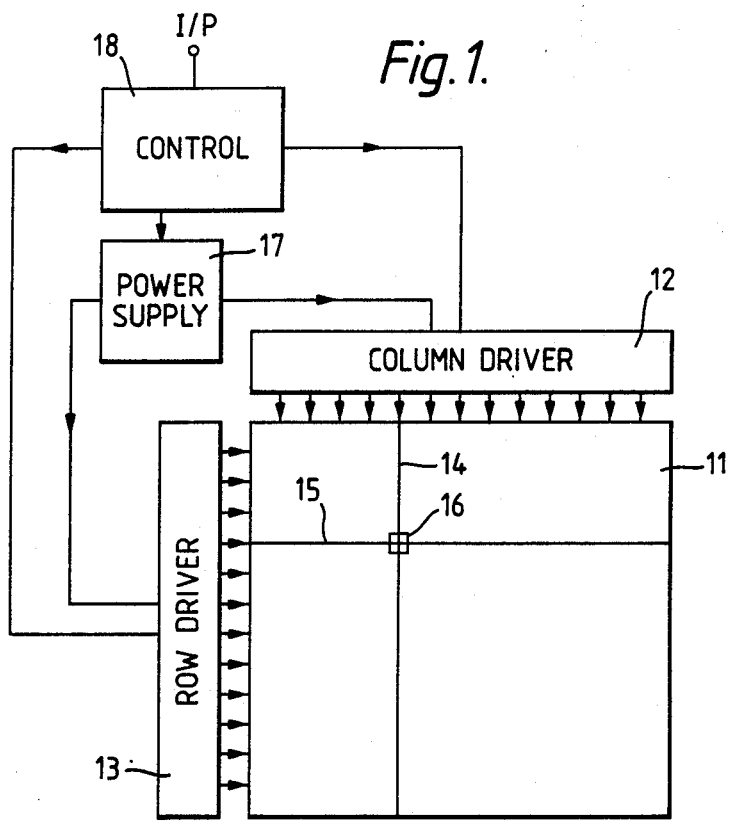
FIG. 1 is a schematic diagram of a matrix addressed display and its associated drive circuitry.

Referring to FIG. 1, the display device includes a display matrix 11, e.g. a large area matrix addressable smectic liquid crystal display. The display 11 is driven via a column driver circuit 12 and a row driver circuit 13 and comprises an array of pixels 16 each of which is addressable via a corresponding pair of column and row conductors 14 and 15. The voltage waveforms required to drive the display are derived from a power supply 17. Operation of the power supply 17 and of the drivers 12 and 13 is controlled in response to input data signals via a control circuit 18. The control circuit provides row and column information to select individual pixels of the display and provides synchronisation of the display with the input signal.

In use, two operations must be performed on the pixels of the display matrix:
1   Scatter—liquid turns cloudy
2   Clear—liquid crystal turns clear.

The different waveforms that must be applied for scatter are illustrated in FIG. 2. These allow individual row selectivity. Individual row and column (pixel) selectivity is required for clear and the waveforms that allow this are shown in FIG. 3. Typically, the following choice of voltage and frequency is used:

VR=200 V, VC=50 V, frequency=30 Hz provides scatter

VR=140 V, VC=35 V, frequency=2 kHz provides clearing

Both the scattered and cleared states have inherent memory, i.e. the liquid crystal retains its state indefinitely without further electrical drive. Thus, the drivers can also produce zero volts at their outputs for the no change idling case. Note that in both the scatter and clear cases, unselected pixels do have voltages impressed across them. However, the liquid crystal exhibits a threshold effect and so long as the threshold voltage is not exceeded, there is no change of state.

To summarise:

Each row driver produces zero volts or an AC one cycle waveform (one phase ±VR).

Each column driver must produce zero volts or an AC one cycle waveform (either phase ±VC or ±VC).

Figure 4:
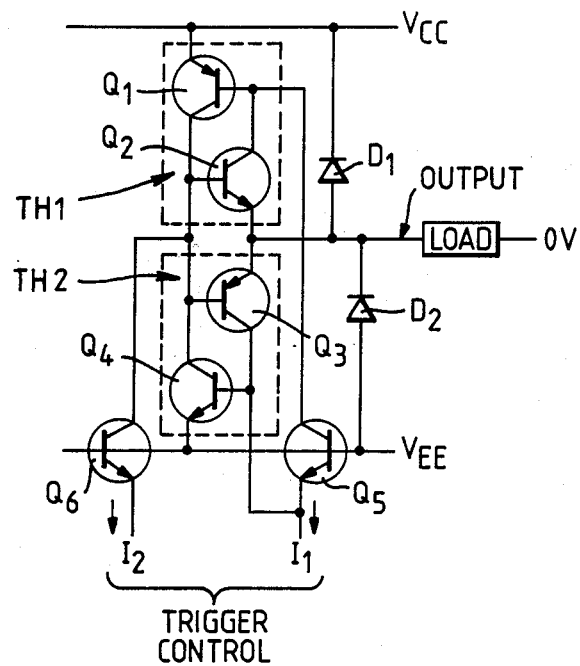
FIG. 4 shows a row or column driver output stage for use with the display of FIG. 1.

As shown in FIG. 4, the driver output stage consists of 2 thyristors across the power supply. Although each thyristor is drawn as a PNP/NPN combination (Q1/Q2 and Q3/Q4), the structure can be designed compactly as collector/base regions are shared. The common base connection between Q2 and Q3 ensures that only one thyristor can be on at any time. Q1/Q2 is triggered on by turning on Q5; Q3/Q4 by Q6. Q5 and Q6 share collectors with Q2 and Q4 respectively which again helps keep layout compact. Only one of the trigger control transistors Q5 and Q6 is allowed to come on at any one time—it turns on to trigger the thyristor it is controlling and remains on for the duration of the half cycle (FIG. 5) to prevent the thyristor from dropping out of the conducting state if the load current falls below the thyristor's sustaining current. This avoids relaxation oscillator behaviour with capacitive loads. FIG. 4 also shows clamp diodes (D1, D2) from the output to the supply rails. These are needed due to the capacitive nature of the load.

Figure 5:
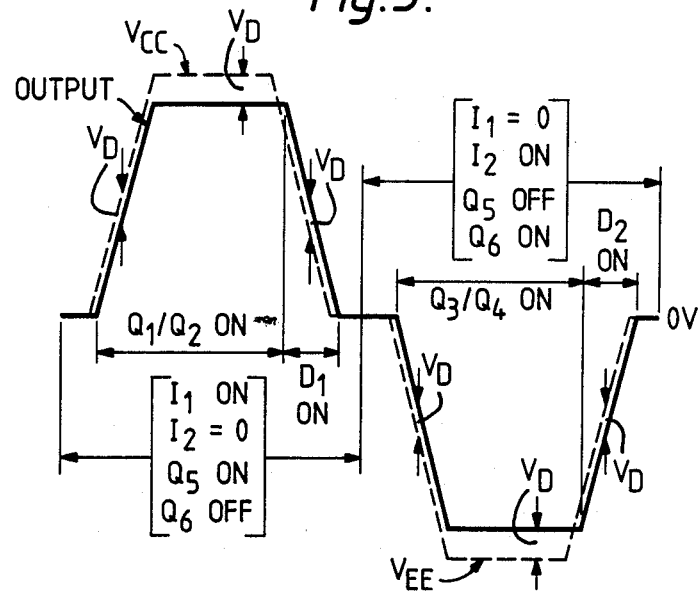
FIG. 5 illustrates the output waveform associated with the circuit of FIG. 4.

As shown in FIG. 5 the row drive waveform comprises a single alternating voltage cycle provided by a positive going pulse followed by a negative going pulse. There is a short zero voltage interval between the two pulses. This ensures that the maximum voltage stress applied to the display is limited to one half of the peak to peak voltage of the drive waveform. The pulse voltages follow the power supply voltages $V_{cc}$ and $V_{EE}$ although, in practice, there is a small voltage drop $V_D$ caused by the voltage drops of the thyristors and of the clamp diodes.

Figure 6:
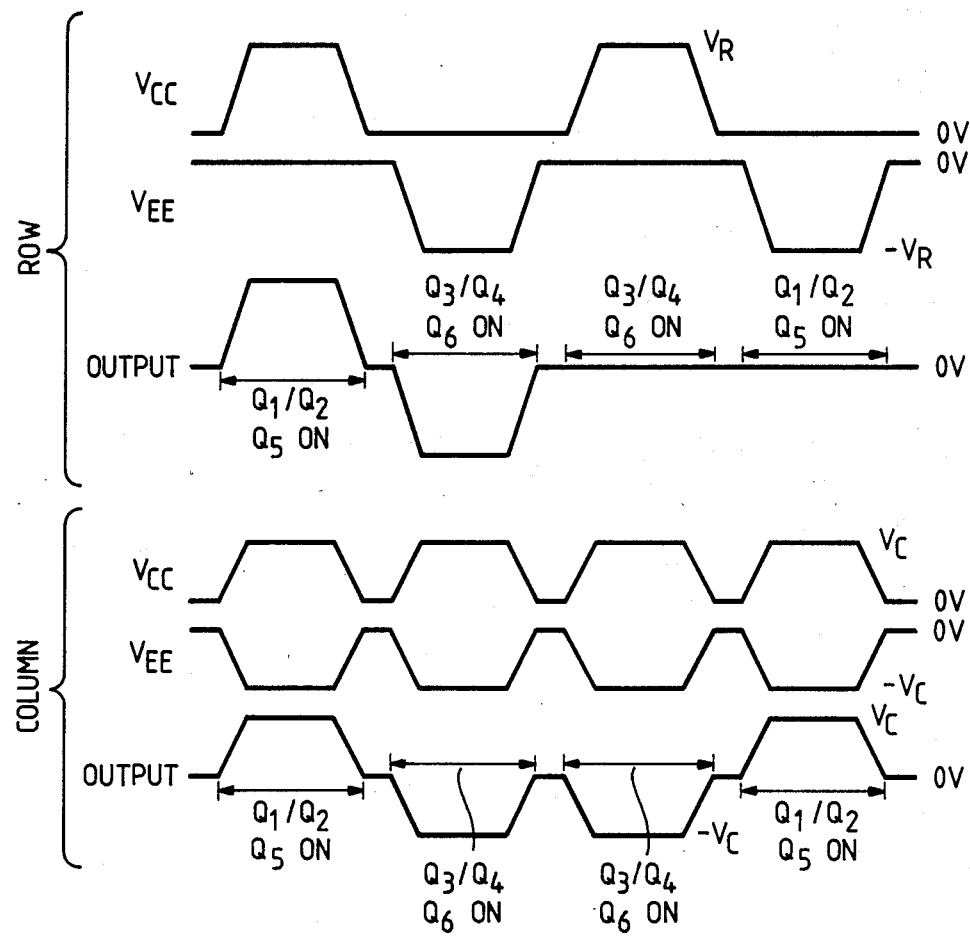
FIG. 6 illustrates the manner in which row and column output waveforms are derived from alternating supply voltages.

FIG. 6 shows how the row waveforms can be generated. Here, the supply scheme differs from conventional techniques. Instead of constant DC supplies, the power supply pulses high or low from zero volts. By switching the output to the appropriate supply rail (by turning on the transistors as indicated), zero or alternating voltage can be produced. Using the same driver circuit but changing the supply waveforms and again switching the output to the appropriate supply rail allows the 2 phases of the alternating column waveforms to be generated. As VR is now the maximum voltage across the row driver, the voltage stress on the output stage is effectively halved. Note also that 3 output states can effectively be produced by a compact circuit which basically produces only 2 states.

The supply switching sequence for both row and column supplies includes a time when the supply voltage across the output stage is zero. It is during this time that the trigger current may be transferred from one thyristor to the other (Q5 on, Q6 off to Q5 off, Q6 on or vice versa). The supply rails are then slewed to the desired values. Operated under these conditions, the voltage drop across the conducting thyristor is typically less than 1 volt (VD, FIG. 5). At the same time, the controlled slewing of the supplies limits and defines the peak current into the capacitive load. Thus, switching under conditions of large voltage current product is avoided leading to reduced dissipation and increased reliability. Also, the slew rate applied across individual pixels is uniform being now defined by the power supplies and not by individual output driver characteristics which will suffer the inevitable production spreads—thus a uniform visual appearance is achieved across the display panel as it is driven uniformly.

FIG. 7 shows a circuit for generating suitable alternating waveforms. The positive and negative terminals of a floating voltage supply V are selectively grounded, or connected to a reference potential, via a control clock signal at input I/P applied to the gates of complementary field effect transistors T71 and T72. Slewing of the corresponding output signal to provide the trapezoidal shaped output waveform shown in FIG. 5 is effected via capacitor C which provides feedback to complementary bipolar transistors Q71 and Q72. The net effect is to turn one or other of the bipolar transistors on for a short period at each change of the clock state thus reducing the voltage at the gate of the corresponding field effect transistor. The slope or slew rate of the rising and falling edges of the waveform is a fraction of the value of the capacitor C and the resistor R71 and of the base emitter voltage drop of the bipolar transistors. To a first approximation this slew rate is given by the expression $$dV/dt = VBE/R71$$

The circuit of FIG. 7, indicated by solid lines, provides the positive going pulses of the required waveform. Simple modification of this circuit, as indicated by the broken lines, provides the negative going trapezoidal pulses. It will be clear that the phase relationship of the positive and negative going pulses is determined by the phase relationship of the clock signals applied to the inputs I/P and I/P¹.

It will be appreciated that the circuit of FIG. 7 is given by way of example only and that other techniques for generating the trapezoidal waveform would also be used.

Figure 8:
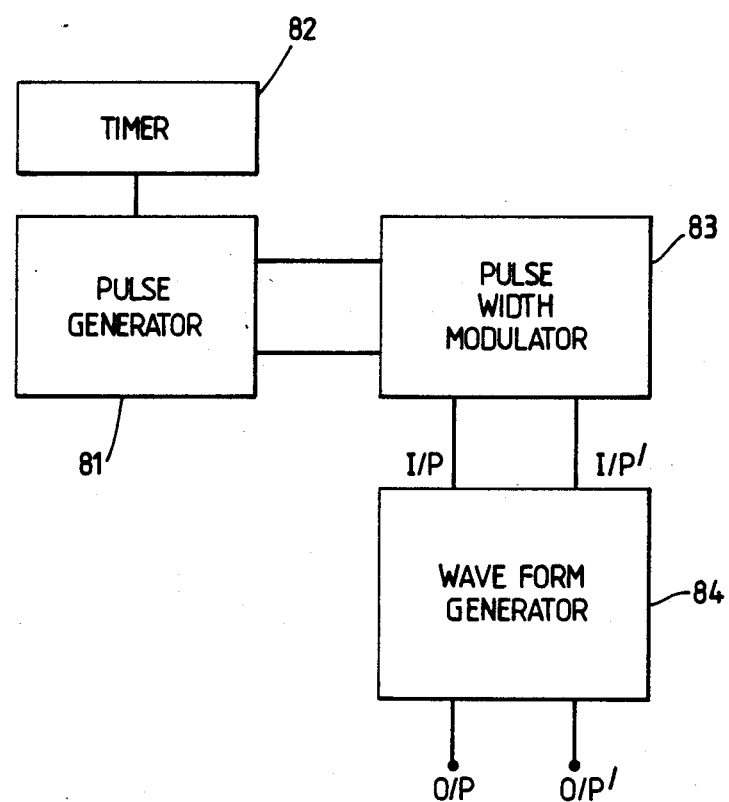
FIG. 8 shows in schematic form the circuitry whereby a period of zero voltage is provided between successive half cycles of the drive waveform.

The preferred technique for ensuring that the successive half cycles of the drive waveform are separated each by a period of zero voltage is described below with reference to FIG. 8 of the accompanying drawings. Referring to FIG. 8, a pulse generator 81 generates first and second streams of rectangular pulses at outputs OP11 and OP12 respectively and at a repetition rate determined by timer 82. The pulse streams are fed via pulse width modulator 83 to inputs I/P and I/P¹ of the waveform generator 84. This waveform generator comprises the circuit described with reference to FIG. 7. The pulse generator, timer and pulse width modulator form part of the control circuit 18 of FIG. 1.

The pulse width modulator 83 limits the width of each pulse such that, even after slewing has been introduced by the waveform generator 84, there is a time period between the falling edge of each pulse and the leading edge of the next pulse from the outputs O/P and O/P¹ of the circuit 84. This ensures that there is a period of zero voltage between successive half cycles of the composite waveform and thus ensures that at no time is the display circuit subjected to a voltage that is greater than between zero voltage and the absolute value of the peak voltage.

Figure 9:
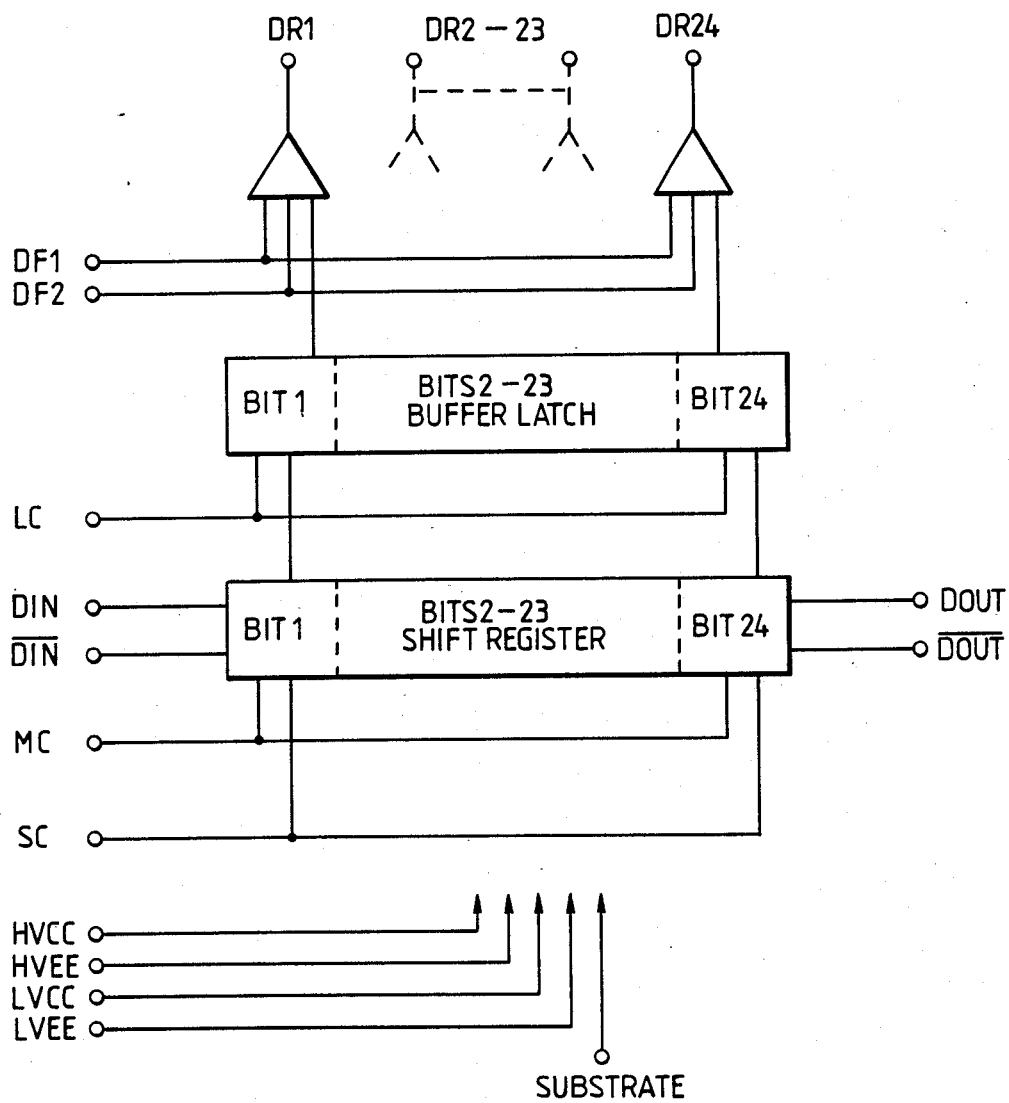
FIG. 9 is a schematic diagram of an integrated circuit for providing the row or column drive of the display arrangement of FIG. 1.

FIG. 9 shows a circuit schematic for providing the row and column driving functions and FIG. 10 illustrates a corresponding data loading sequence. Referring to FIGS. 9 and 10, the input pad connection to the circuit are as follows:

SUBSTRATE—Chip substrate connection.
LVEE—Logic circuit negative supply and substrate connection.
LVCC—Logic circuit positive supply.
HVEE—High voltage driver negative supply; strap to LVCC.
HVCC—High voltage driver positive supply.
DIN, $\overline{\text{DIN}}$—Complementary data inputs.
DOUT, $\overline{\text{DOUT}}$—Complementary data outputs.
MC—Clock for master stages of shift register.
SC—Clock for slave stages of shift register.
LC—Clock for buffer latches.
DF1, DF2—Complementary driver frequency clock inputs.
DR1-24—24 driver outputs.

Serial display data enters a shift register, e.g. a 24-bit shift register, 81 at DIN and $\overline{\text{DIN}}$ and exits, after a delay equal to 24 periods of the MC clock, at DOUT and $\overline{\text{DOUT}}$. In a daisy-chained string of chips, the data loading sequence consists of shifting data into the shift register until the last bit is filled. At this time, the MC and SC clocks are stopped in the high and low states, respectively (FIG. 10). Next, the latch clock LC is pulsed high to load the buffer latch 82 with the new data. This completes the data loading sequence, terminates the current display operation and starts off the next display operation. The provision of buffer latches thus allows data loading without disturbing the current display operation.

Each of the driver outputs DR1-24 consist of a thyristor TH1 (FIG. 4) to HVCC for the pull-up and a thyristor TH2 to HVEE for the pull-down. These thyristors are turned off by reducing the HVCC and HVEE supply voltages to zero. While the supplies are zero, a positive pulse at LC latches in new data. After LC goes low, the latch contains valid new data which is used to set up the control currents to trigger the thyristors when the HVCC and HVEE supplies are brought up.

Data at a particular latch which originated as a high (low) logic level fed into DIN causes the appropriate output to switch to the HVCC and HVEE rails in phase with DF2 (DF1). Row supplies of ±VR volts and column supplies of ±VC volts which switch as shown in FIGS. 10 and 11 allow the required row and column waveforms to be generated. Changes of state of DF1 and DF2 are made while HVCC and HVEE are zero. This reduces dissipation and enhances reliability by avoiding high voltage current product at the switching transition To minimise transient switching currents and dissipation and to avoid false triggering, the switching transitions of the HVCC and HVEE supplies should not exceed the slew rate.

In normal use, inputs HVEE and LVCC are strapped together. The supply across inputs LVCC-LVEE is a constant direct current supply Thus, with respect to ground (0 volts), the LVEE rail pulse up and down at a constant voltage below HVEE. For convenience, FIGS. 11 and 12 show LC, DF1 and DF2 with respect to a constant LVEE. Since LVEE is in fact pulsing, each of these waveforms, when referred to ground, will be observed with a pulsing LVEE superimposed on it.

Figure 13:
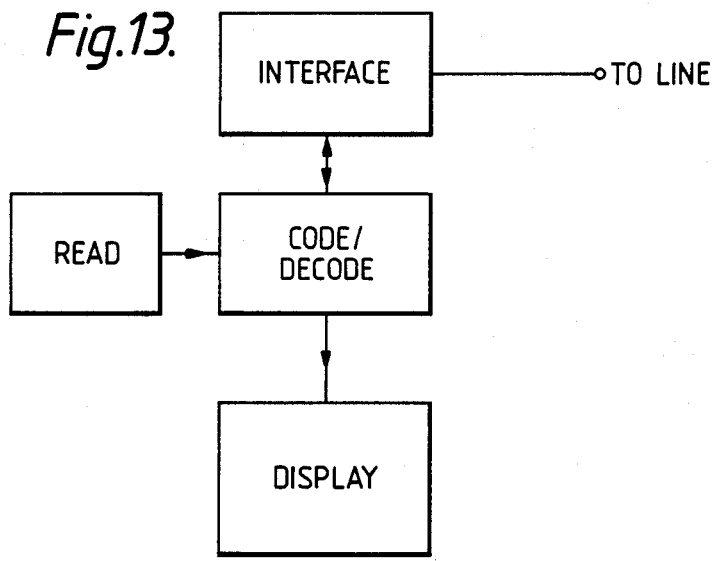
FIG. 13 is a schematic diagram of a facsimile machine incorporating the display of FIG. 1.

FIG. 13 is a schematic diagram of a facsimile machine incorporating the display device of FIG. 1. Incoming signals from a telephone line are fed via an interface unit to a code/decode circuit where digital information corresponding to the configuration of the display is generated. This information is fed via the control circuit (FIG. 1) to the row and column driver circuits whereby the received information is displayed. Information from a document to be transmitted is read and fed via the coder/decoder to the interface circuit for transmission to a remote station.

Whilst the display drive circuitry described herein is intended for use with a smectic A liquid crystal display, it is of course not so limited and may also be used with other forms of liquid crystal display.

We claim:

1. A display device, including a matrix addressed smectic liquid crystal display, row drive and column drive circuits for operation of the display, control means for said row and column drive circuits, and a power supply, wherein said power supply is adapted to provide, from a single floating voltage source, a first waveform comprising positive going pulses and a second waveform comprising negative going pulses, said waveform being of equal pulse repetition rate, wherein each said drive circuit includes means for sampling said positive going and negative going waveforms for deriving therefrom, in response to signals from the control circuit, a series of single cycle alternating output waveforms and zero voltage signals whereby, in use, the pixels of the display may be driven to a scattered state, a cleared state, or an unchanged state, the display device being such that there is a period of zero voltage between successive half cycles of the output waveforms, wherein the relative timing of said positive going and negative going waveform is such that at no time are both a positive going and a negative going pulse simultaneously present thereby limiting the maximum voltage stress applied to a said drive circuit to one half of the peak voltage of its corresponding alternating output waveform, wherein each said row drive and column drive circuit has outputs one for each corresponding row or column of the display, and wherein each output comprises a pair of thyristors whereby, in use, the waveforms are sampled selectively to provide display drive signals.

2. A display as claimed in claim 1, wherein each said row drive and column drive circuit includes a shift register for receiving and storing display information.

3. A display device as claimed in claim 2, wherein said pulses are trapezoidal in form.

4. A facsimile machine incorporating a display device as claimed in claim 1.

* * * * *